(12) United States Patent
Pozzoni et al.

(10) Patent No.: US 6,300,195 B1
(45) Date of Patent: Oct. 9, 2001

(54) PROCESS FOR MANUFACTURING SEMICONDUCTOR INTEGRATED MEMORY DEVICES WITH CELLS MATRIX HAVING VIRTUAL GROUND

(75) Inventors: Pierantonio Pozzoni, Arcore; Claudio Brambilla, Concorezzo; Sergio Cereda, Lomagna; Paolo Caprara, Milan, all of (IT); Rustom Irani, Santa Clara, CA (US)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/512,900

(22) Filed: Feb. 25, 2000

(30) Foreign Application Priority Data

Feb. 26, 1999 (EP) .................................................. 99830100

(51) Int. Cl.⁷ .................................................. H01L 21/336
(52) U.S. Cl. ............................................ 438/257; 438/201
(58) Field of Search .................................. 438/257, 258, 438/262, 263, 264, 266, 291, 201, 211, 216, 296, 443, 444, 396, 253

(56) References Cited

U.S. PATENT DOCUMENTS

| | | | |
|---|---|---|---|
| 5,087,584 | * | 2/1992 | Wada et al. ........................... 438/264 |
| 5,346,586 | | 9/1994 | Keller .................................... 156/656 |
| 5,723,350 | * | 3/1998 | Fontana et al. ....................... 438/257 |
| 6,057,192 | * | 5/2000 | Colabella ............................. 438/264 |

FOREIGN PATENT DOCUMENTS

| | | |
|---|---|---|
| 0 573 728 A | 12/1993 | (EP) . |
| 55 08323 A | 6/1980 | (JP) . |
| 60 059737 A | 4/1985 | (JP) . |
| WO 94/20989 | 9/1994 | (WO) . |

* cited by examiner

Primary Examiner—David Nelms
Assistant Examiner—David Nhu
(74) Attorney, Agent, or Firm—Theodore E. Galanthay; Robert Iannucci; Seed IP Law Group, PLLC

(57) ABSTRACT

A process for manufacturing electronic semiconductor integrated electronic memory devices having virtual ground and including at least a matrix of floating gate memory cells formed on a semiconductor substrate with a plurality of continuous bit lines extending across the substrate as discrete parallel strips begins with forming an oxide layer over the matrix region. Then, the semiconductor throughout is deposited with a stack structure which includes a first conductor layer, a first dielectric layer, and second conductor layer. Next, a second dielectric layer is formed. Floating gate regions are defined by photolithography using a mask of "POLY1 along a first predetermined direction", and associated etching, to define, in the stack structure, a plurality of parallel openings. These openings are implanted to confer a predetermined conductivity on the bit line regions. Next, the parallel openings are filled with a photo-sensitive material to protect the matrix bit lines.

15 Claims, 5 Drawing Sheets

PROCESS FOR MANUFACTURING SEMICONDUCTOR INTEGRATED MEMORY DEVICES WITH CELLS MATRIX HAVING VIRTUAL GROUND

TECHNICAL FIELD

This invention relates to an improved process for manufacturing semiconductor integrated electronic memory devices with a cell matrix having a virtual ground, and more specifically, to manufacturing memory devices made from floating gate memory cells and having a plurality of continuous bit lines extending across a substrate as discrete parallel strips.

BACKGROUND OF THE INVENTION

The invention relates, particularly but not exclusively, to a process for manufacturing electronic semiconductor integrated electronic memory with cells matrix having virtual ground, and throughout the following description, reference will be made to that technical field for convenience of illustration. Discussion of elements or fabrication processes well known to those skilled in the art has been abbreviated or eliminated for brevity.

Electronic semiconductor-integrated EPROM or Flash EPROM memory devices include a plurality of non-volatile memory cells organized in matrix form; that is, the cells are arranged therein into rows, or word lines, and columns, or bit lines.

Each non-volatile memory cell includes a MOS transistor having a floating gate electrode located above the channel region. The floating gate electrode has a high D.C. impedance to all the other terminals of the same cell and the circuit whereto the cell is incorporated.

Each cell also has a second electrode, or control gate, which is driven by means of appropriate control voltages. The other transistor electrodes are, as usual, the drain and source terminals.

In recent years, considerable effort went to the development of memory devices with increased circuit density. This effort resulted in electrically programmable non-volatile memory matrices of the contactless type being developed which have a so-called "tablecloth" or crosspoint structure. An example of matrices of this kind, and their manufacturing process, is described in European Patent No. 0 573 728 of this applicant, incorporated herein by reference.

In matrices of this type, the matrix bit lines are formed in the substrate as continuous parallel diffusion strips. These matrices are formed by memory cells which comprise floating gate capacitive coupling MOS devices.

The process flow for manufacturing such memory cells includes forming, on a semiconductor substrate, mutually parallel stack strips which have a first layer of gate oxide, a layer of first polysilicon, an interpoly oxide layer, and a layer of second polysilicon.

An implantation step is then carried out to form the bit lines, and after the deposition of a planarizing layer, the matrix word lines are formed.

In the prior art, the gate regions of the individual cells are then defined by self-aligned etching. However, this first solution has several drawbacks, one of which is that in cells having small size, the self-aligned etch step becomes more critical.

SUMMARY OF THE INVENTION

An embodiment of the invention provides a process for defining memory cells, arranged into matrices of the crosspoint type, which have such structural and functional features as to avoid the need for a critical gate region defining step, thereby overcoming the limitations and drawbacks which still beset the memory cells of prior art crosspoint matrices. One embodiment of the invention fully defines each gate region of the matrix cells by means of an oxide island, before the matrix bit lines are defined.

In one embodiment of the invention, a process for manufacturing electronic semiconductor integrated electronic memory devices having virtual ground and comprising at least a matrix of floating gate memory cells is provided. The matrix is formed on a semiconductor substrate with a plurality of continuous bit lines extending across the substrate as discrete parallel strips. The method includes first forming an oxide layer over the matrix region, and depositing on the semiconductor a stack structure which includes a first conductor layer, a first dielectric layer, and second conductor layer. Then a second dielectric layer is formed. Floating gate regions are defined by photolithography using a mask of "POLY1 along a first direction", and associated etching is used to form, in the stack structure, a plurality of parallel openings. Next the parallel openings are implanted to confer a predetermined conductivity on the bit line regions. Finally, the parallel openings are filled with a photo-sensitive material to protect the matrix bit lines.

The features and advantages of a device according to the invention will become apparent from the following description of an embodiment thereof, given by way of non-limitative example with reference to the accompanying drawings.

DETAILED DESCRIPTION OF THE INVENTION

Figure 1:
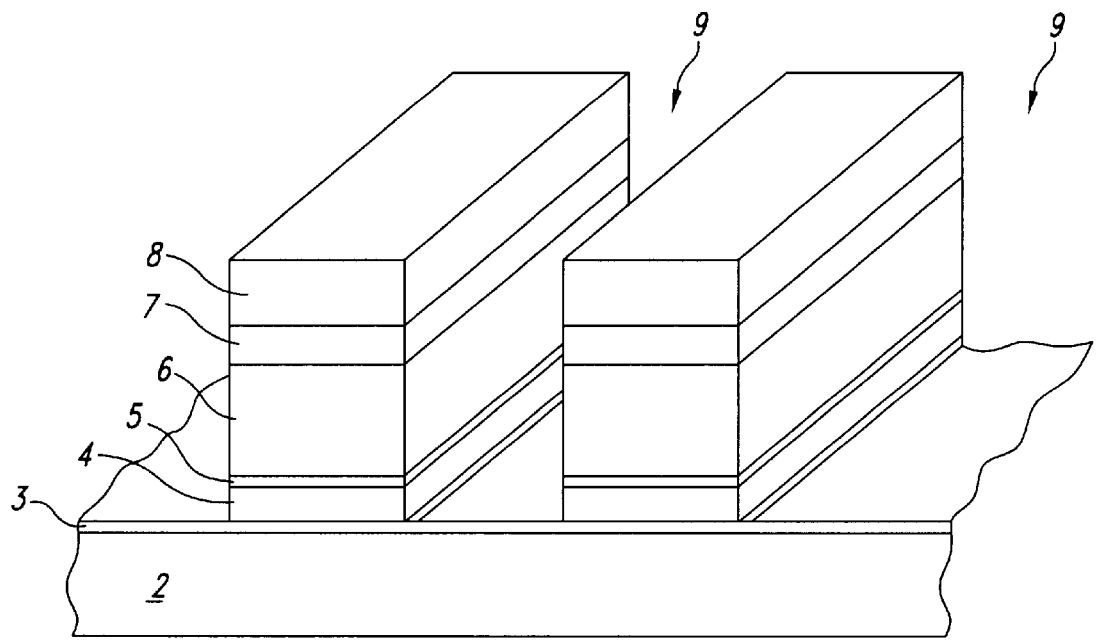
FIGS. 1 to 5 are perspective views showing a portion of a semiconductor in the evolution of a first embodiment of the manufacturing process according to the invention.

An improved process for manufacturing electronic memory devices integrated in a semiconductor substrate and comprising virtual ground cell matrices will be described with reference to the drawings.

The process steps discussed hereinafter do not form a complete process flow for manufacturing integrated circuits. The present invention can be used with the integrated circuit manufacturing techniques currently employed in the art, and of the process steps commonly used, only such as are necessary for an understanding of the invention will be considered. Those Figures which show in perspective portions of an integrated circuit during their manufacturing are not drawn to scale, but rather to highlight important features of the invention. Accordingly, the description which follows will be limited to the definition of the memory matrix, without this being restrictive for the Applicant.

To form memory cells with floating gate capacitive coupling MOS devices on a semiconductor substrate 2, the process flow should provide for a multiple deposition onto the entire semiconductor area in order to produce a stack structure comprising a layer of gate oxide 3, a first conductor layer 4 (also referred to as POLY1), an interpoly dielectric layer 5, and a second conductor layer 6 ( also referred to as a POLY CAP).

Typically, the material used for the conductor layers 4 and 6 would be polysilicon, and the intermediate dielectric layer could be ONO (Oxide-Nitride-Oxide), for example.

At this step of the process, the poly cap layer 6 can be doped.

A protective dielectric layer 7, e.g., a so-called top oxide, is deposited on top of the poly cap layer 6.

At this step of the manufacturing process, bit lines 10 of the cell matrix are defined. A first mask 8 of photoresist, referred to as a mask for defining the Poly1 along a first predetermined direction, is used to define the bit lines 10. The first mask 8 is shown in FIG. 1.

Using a conventional photolithographic step, the stack structure that is not covered by the first mask 8 is then etched away in cascade to remove the protective dielectric layer 7, the poly cap layer 6, interpoly dielectric layer 5, and first conductor layer 4, in that order. Advantageously, the gate oxide layer 3 is not removed from the substrate 2 surface during this etching step.

This first etching step defines a plurality of openings or grooves 9 in the stack structure, as seen in FIG. 1.

Figure 2:
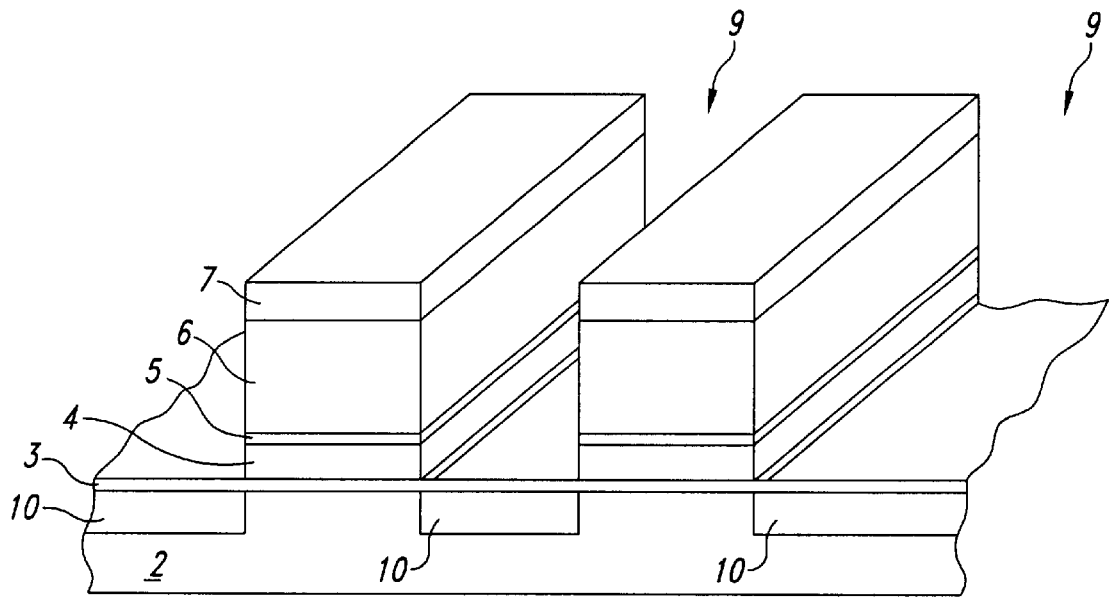

An ion implantation, for example Arsenic as necessary to provide N+ electric conductivity, allows the bit lines 10 to be defined through the openings 9. The first mask 8 is then removed. (FIG. 2)

Figure 3:
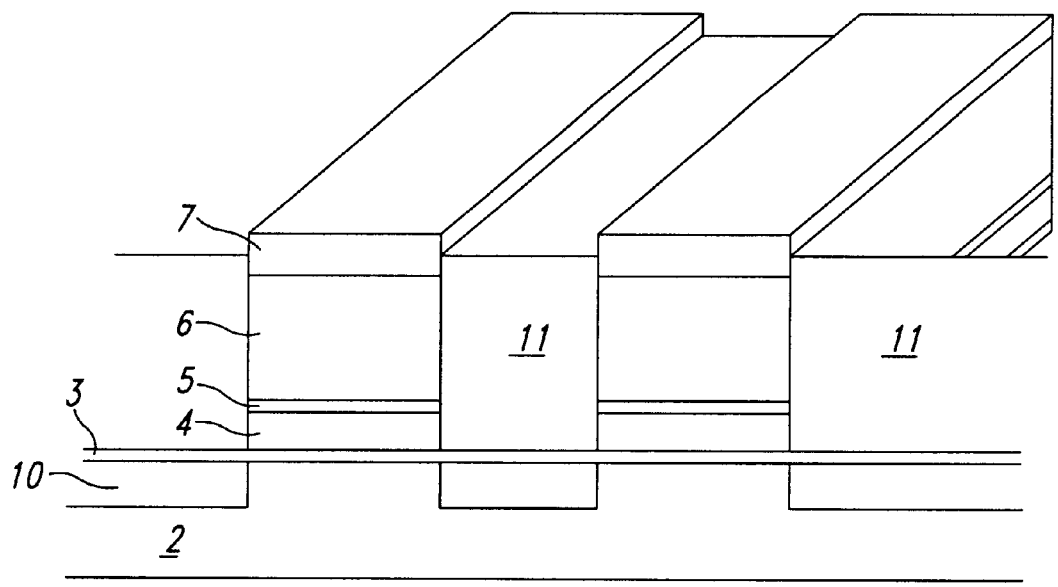

The process continues with the deposition of an energy-reactive material, such as a photo-sensitive layer or photo-resist 11, into the grooves 9 of the matrix and on the semiconductor 2 surface. (FIG. 3)

By a conventional unmasked exposition step and subsequent removal of the surface layer of exposed resin, the photoresist 11 is caused to fill the openings 9. This can be achieved by just focusing on the surface portion of the semiconductor during the exposition step.

Figure 4:
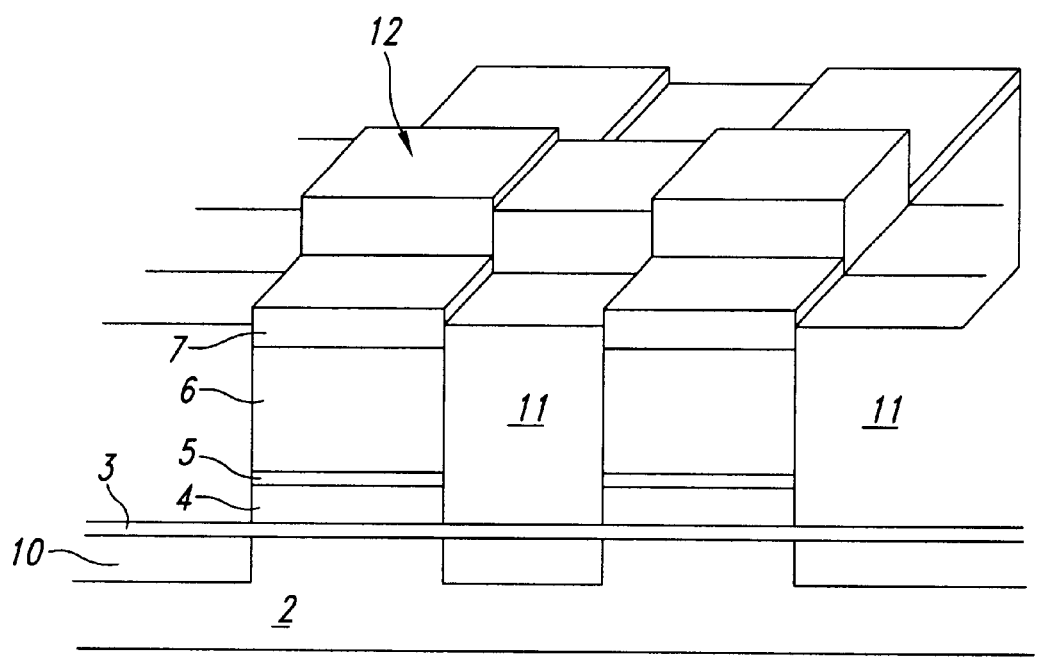

A second resist mask 12, referred to as a mask for defining the Poly1 along a second predetermined direction, is used to define gate regions 13 of the matrix cells. The second mask 12 is shown in FIG. 4.

Figure 5:
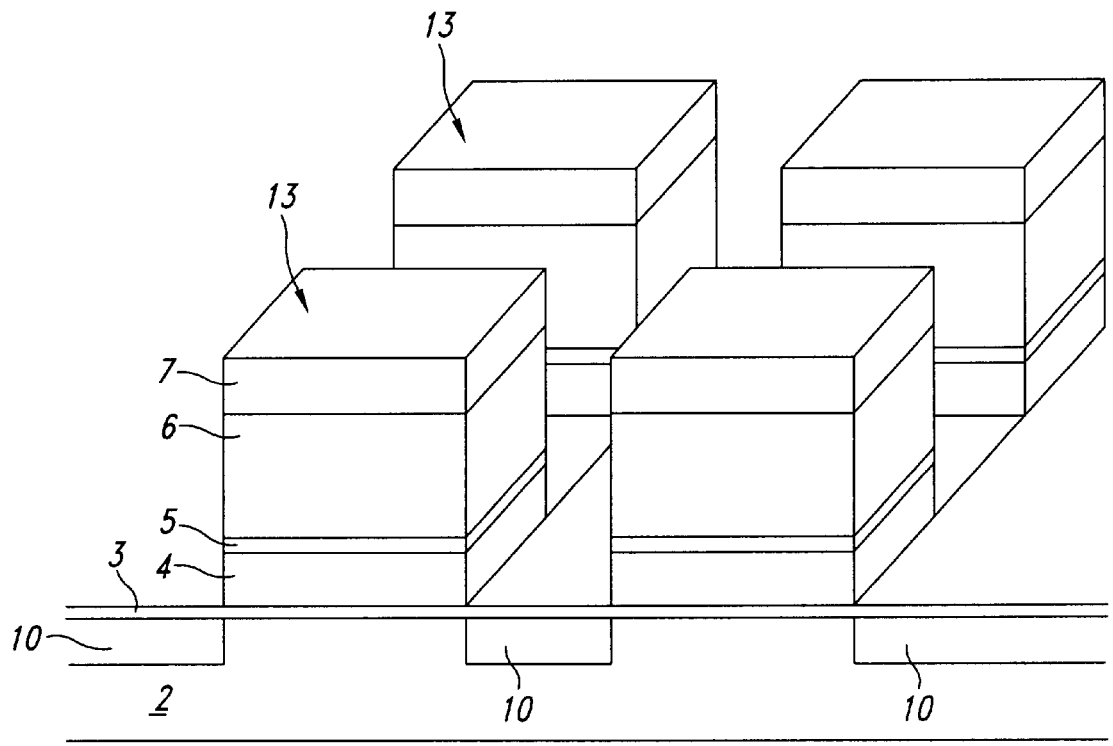

The portion of the stack structure that is unprotected by the second mask 12 is cascade etched using a conventional photolithographic step to remove the protective dielectric layer 7, the second conductor layer 6, the intermediate dielectric layer 5, and the first conductor layer 4, in that order. At this point, the substrate surface will appear as formed of a plurality of gate regions 13 of the matrix memory cells, as shown in FIG. 5.

The process for manufacturing virtual ground memory matrices progresses now through known steps to one skilled in the art.

To summarize, the process of an embodiment of the invention allows the gate regions 13 of the matrix cells to be defined using an oxide island for masking off and protecting the underlying layers, and utilizes a layer of photo-sensitive resin 11 to protect the bit lines of the matrix.

A second embodiment of the invention provides for multiple deposition over the entire area of a semiconductor 102, in order to provide a stack structure comprising a gate oxide layer 103, a first conductor layer 104 (also referred to as POLY1), an interpoly dielectric layer 105, and a second conductor layer 106 (also referred to as a POLY CAP).

Typically, the material used for the conductor layers 104 and 106 would be polysilicon, and the interpoly dielectric layer 105 could be ONO (Oxide-Nitride-Oxide), for example.

At this step of the process, the poly cap layer 106 can be doped.

A protective dielectric layer 107, e.g., a so-called top oxide, is deposited on top of the poly cap layer 106.

Figure 6:
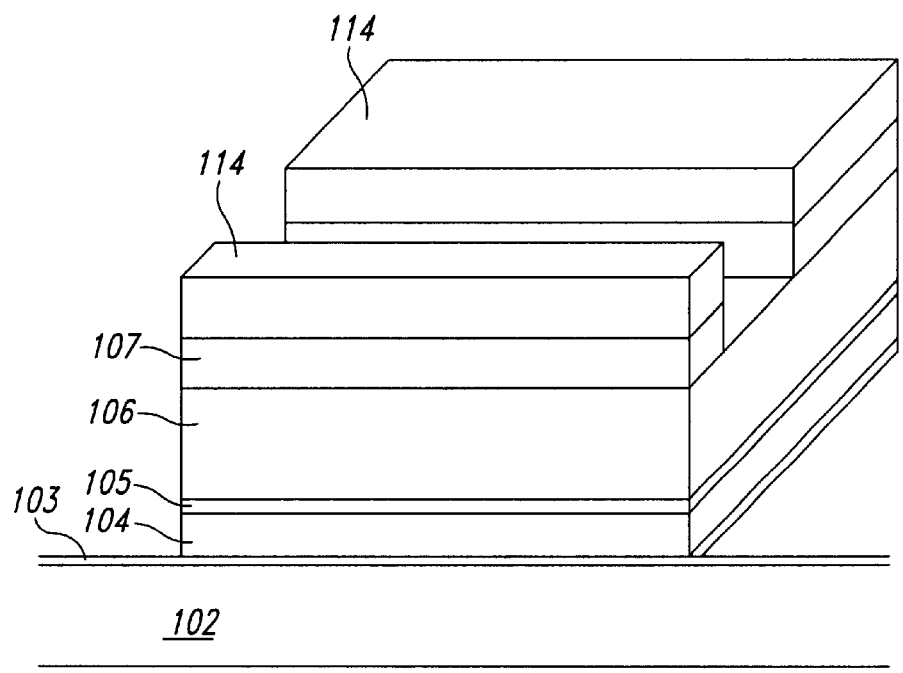
FIGS. 6 to 10 are perspective views showing a portion of a semiconductor in the evolution of a second embodiment of the manufacturing process according to the invention.

At this step of the manufacturing process according to this embodiment of the invention, a first mask 114 of resist, referred to as a mask for defining the Poly1 along a first predetermined direction, is used to define the protective dielectric layer 107. The first mask 114 is shown in FIG. 6. This differs from the first embodiment, where the entire stack structure was defined.

Using a conventional photolithographic step, the protective dielectric layer 107 is subjected to etching, followed by removal of the first mask 114.

A second resist mask 115, referred to as a mask for defining the Poly1 along a second predetermined direction, is used to define the bit lines 110 of the matrix. (FIG. 7).

The stack structure that is unprotected by the second mask 115 is cascade etched using a conventional photolithographic step to remove the protective dielectric layer 107, the second conductor layer 106, the intermediate dielectric layer 105, and the first conductor layer 104, in that order.

Advantageously, the gate oxide layer 103 would not be removed from the substrate 102 surface during this etching step.

Figure 7:
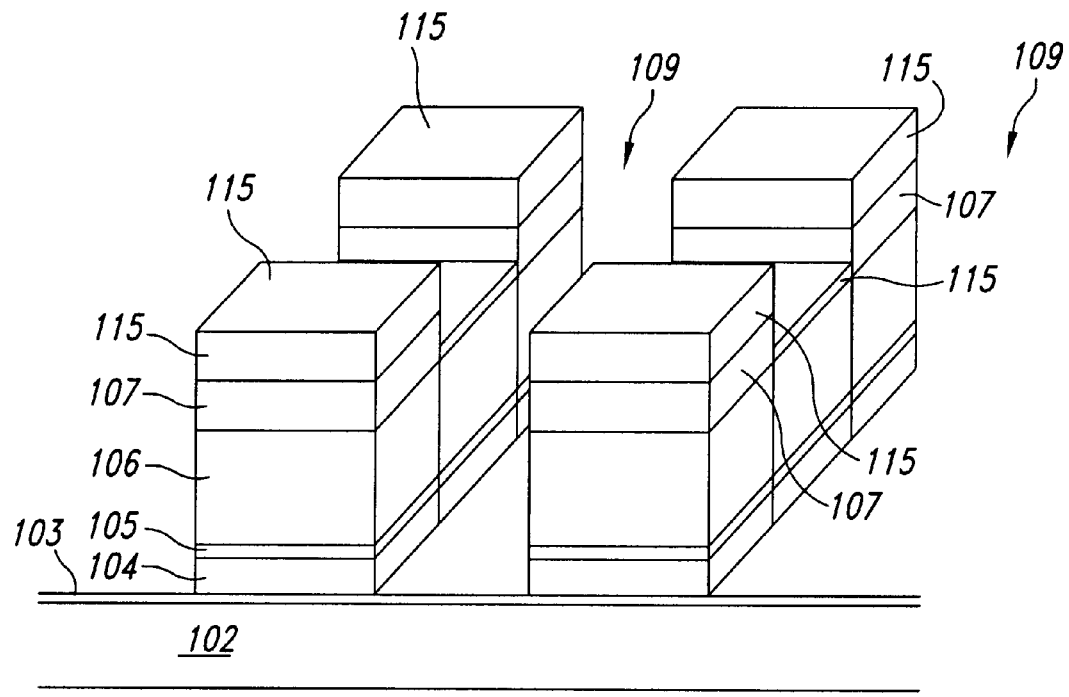

A plurality of openings 109 will have been defined at this location in the stack structure, as shown in FIG. 7.

Figure 8:
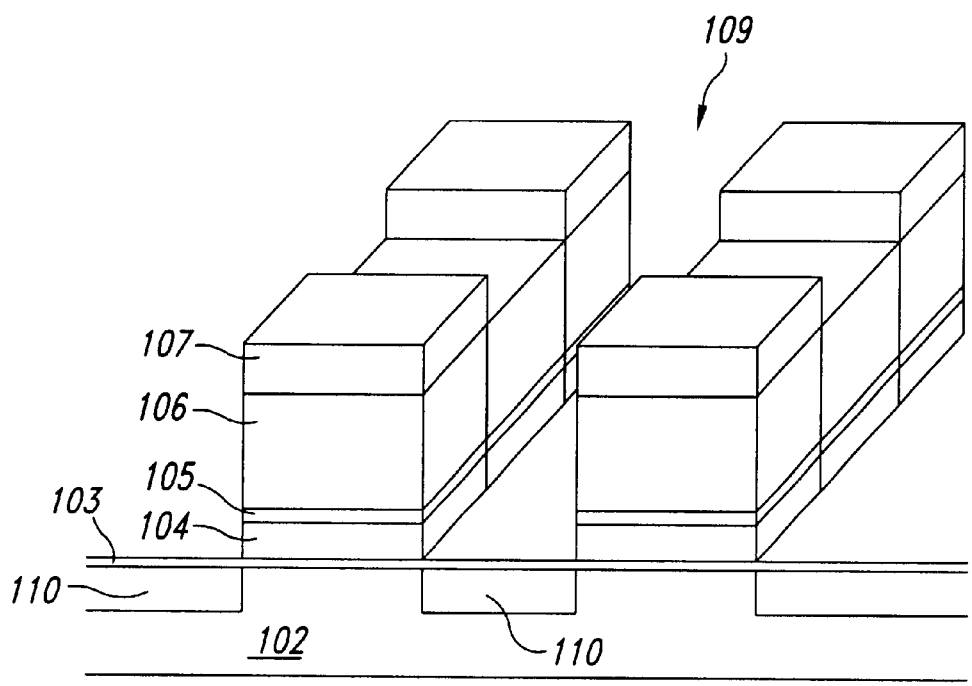

An ion implantation, for example Arsenic as necessary to provide N+ electric conductivity, allows bit lines 110 to be defined through the openings 109. The second mask 115 is then removed. (FIG. 8).

Figure 9:
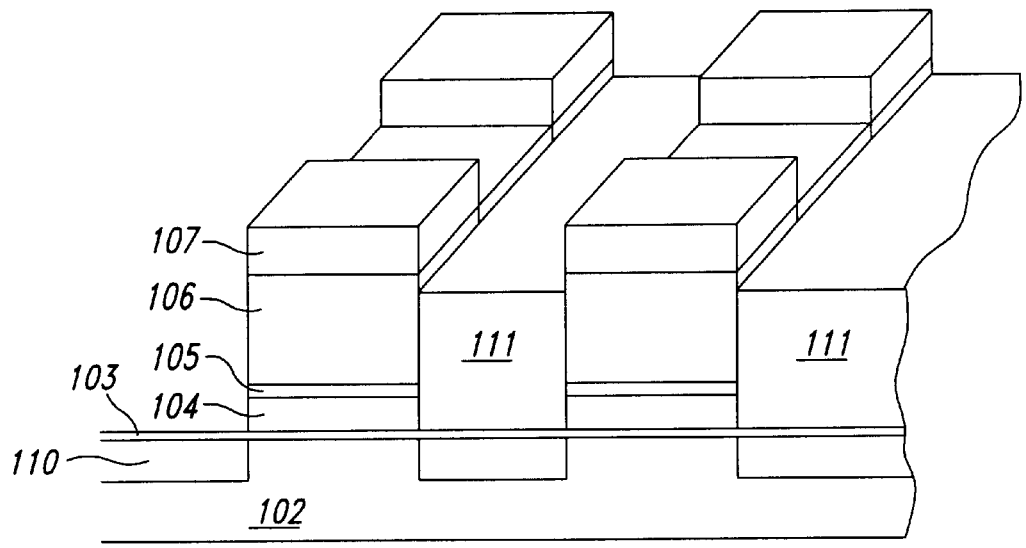

The process is continued with the deposition of an energy-reactive material, such as a photo-sensitive layer 111, which could be a photo-sensitive resin, into the grooves 109 of the matrix, shown in FIG. 9.

By a conventional unmasked exposition step and subsequent removal of the surface layer of exposed resin, the photo-sensitive resin 111 is caused to fill the openings 109. This can be achieved by just focusing on the surface portion of the semiconductor during the exposition step.

The stack structure that is not protected by the second mask is cascade etched using a conventional photolithographic step to remove the protective dielectric layer 107, the second conductor layer 106, the intermediate dielectric layer 105, and the first conductor layer 104, in that order.

Figure 10:
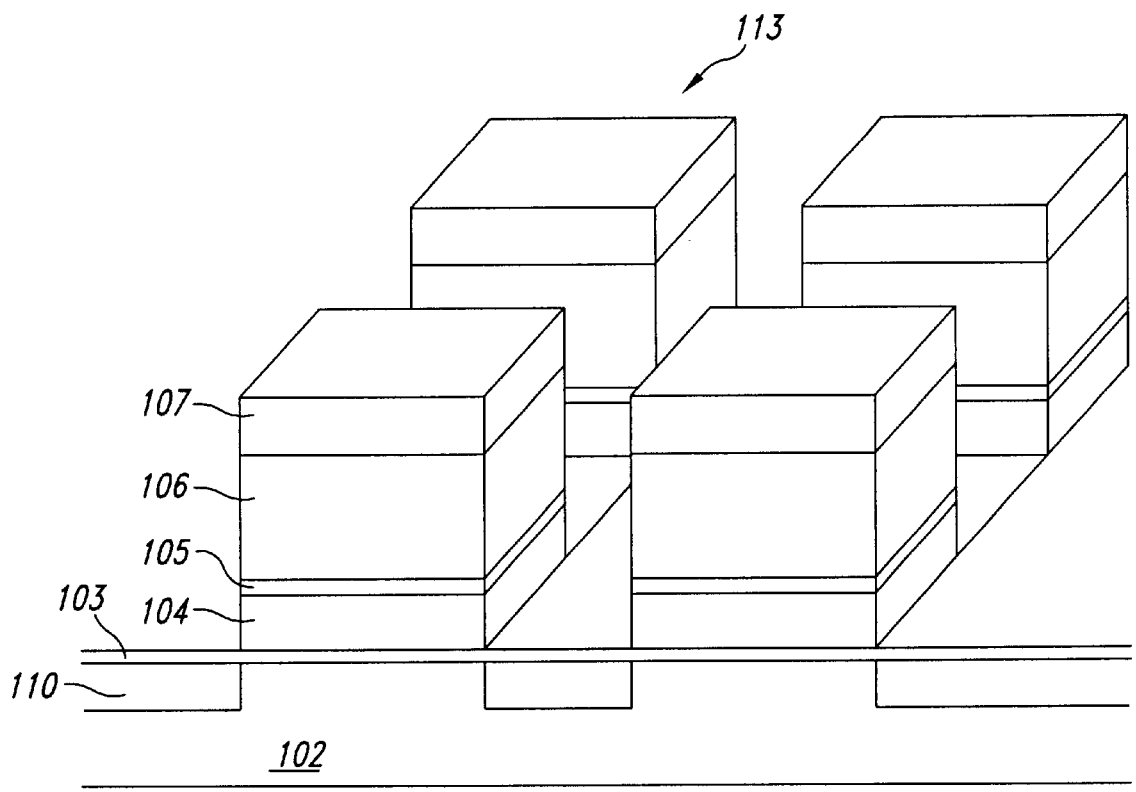

At this point, the substrate surface will appear as formed of a plurality of gate regions 113 of the matrix memory cells, as shown in FIG. 10.

The process for manufacturing virtual ground memory matrices progresses now through known steps to the skilled one.

To summarize, the process of an embodiment of the invention allows the gate regions of the matrix cells to be defined using an oxide island 113 for masking off and protecting the underlying layers, and utilizes a layer of photo-sensitive resin 111 to protect the bit lines 110 of the matrix.

Furthermore, compared to the prior art, the self-aligned etch step for defining the gate regions of the matrix, which step becomes fairly critical as the geometric dimensions of the cell decrease, is now eliminated.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing electronic semiconductor integrated memory devices having a virtual ground and comprising at least one matrix of floating gate memory cells, the matrix being formed on a semiconductor substrate with a plurality of continuous bit lines extending in parallel across the substrate, the process comprising:

forming an oxide layer on the semiconductor substrate;

forming a stack structure over the semiconductor substrate, the stack structure including a first conductor layer, a first dielectric layer, and a second conductor layer;

depositing a second dielectric layer over the stack structure;

using a polysilicon mask of a first direction to define and etch the stack structure into a plurality of parallel stack strips which delimit a first dimension of floating gate regions of the floating gate memory cells, and into a plurality of parallel openings located between the parallel stack strips, respectively;

implanting a dopant into the semiconductor substrate underlying at least one of the plurality of parallel openings to form at least one of the plurality of continuous bit lines; and filling the at least one of the plurality of parallel openings with an energy-reactive material to protect the at least one of the plurality of continuous bit lines.

2. The process according to claim 1, further comprising reacting a portion of the energy-reactive material with an activation energy.

3. The process according to claim 1 wherein filling the plurality of parallel openings with an energy-reactive material comprises filling the at least one of the parallel openings with a photoresistive layer.

4. The process according to claim 1, further comprising, after implanting a dopant into the semiconductor substrate, removing the polysilicon mask of the first direction.

5. The process according to claim 1 wherein depositing a second dielectric layer over the stack structure comprises depositing an oxide layer.

6. The process according to claim 1, further comprising:

using a polysilicon mask of a second direction to define and etch at least one of the plurality of parallel stack strips into a plurality of islands, which delimit both the first dimension and a second dimension of the floating gate regions of the floating gate memory cells.

7. A process for manufacturing portions of device regions formed on a semiconductor substrate comprising:

forming a stack structure on the semiconductor substrate, said stack structure including at least a stack layer to be defined and a protective layer;

positioning on said stack structure a first mask having definition along a first direction, to thereby define in said protective layer a plurality of first parallel strips;

etching away first portions of said protective layer to define said plurality of first parallel strips and expose portions of said stack layer;

positioning on said stack structure a mask having definition along a second direction to define a plurality of second parallel strips;

etching away portions of said stack layer and said protective layer of said stack structure to define said plurality of second parallel strips;

implanting a dopant into portions of the semiconductor substrate not covered by said plurality of second parallel strips to form a plurality of continuous bit lines;

filling said parallel openings between the plurality of said second parallel strips with a photoresistive material to protect the plurality of continuous bit lines; and etching away said portions said stack layer that were exposed by etching away said first portions of said protective layer, thereby defining the device regions.

8. A method of making an integrated circuit, comprising:

forming an insulating layer on a semiconductor substrate;

forming a first layer disposed on the insulating layer;

forming a second layer disposed on the first layer;

forming a protective layer disposed over the semiconductor substrate;

masking a first portion of the protective layer with a first mask, the first portion of the protective layer delimiting a plurality of parallel strips extending in a first direction;

etching the first portion of the protective layer, the second layer, and the first layer to form the plurality of parallel strips disposed over the semiconductor substrate;

implanting a dopant through the insulating layer into a portion of the semiconductor substrate not covered by the plurality of parallel strips to form bit lines; and filling an area between at least two of the plurality of parallel strips with an energy-reactive material to protect the bit lines.

9. The method of claim 8, further comprising:

exposing a portion of the energy-reactive material with an exposing energy.

10. The method of claim 9 wherein exposing a portion of the energy-reactive material with an exposing energy comprises focusing an exposing energy only on a top portion of the energy-reactive material.

11. The method of claim 10 wherein exposing a portion of the energy-reactive material with an exposing energy comprises exposing a photo-reactive material.

12. The method of claim 8, further comprising:

masking a first portion of at least one of the plurality of parallel strips with a second mask, the first portion of the at least one of the parallel strips delimiting a plurality of islands; and etching the at least one of the parallel strips to form the plurality of islands.

13. The method of claim 8 wherein the first layer is a gate oxide layer and wherein the second layer is a first polysilicon layer, the method further comprising:

forming an interpolysilicon layer disposed on the first polysilicon layer; and forming a second polysilicon layer disposed on the interpolysilicon layer.

14. The method of claim 8, further comprising, after implanting a dopant into a portion of the semiconductor substrate, removing the first mask.

15. The method of claim 12 wherein the plurality of islands are delimited in the first direction and a second direction, and wherein the first direction is substantially orthogonal to the second direction.

* * * * *

UNITED STATES PATENT AND TRADEMARK OFFICE
CERTIFICATE OF CORRECTION

PATENT NO. : 6,300,195 B1
DATED : October 9, 2001
INVENTOR(S) : Pierantonio Pozzoni et al.

It is certified that error appears in the above-identified patent and that said Letters Patent is hereby corrected as shown below:

Title page,
Item [73], "STMicroelectronics S.r.l., Agrate Brianza (IT)" should read --
STMicroelectronics S.r.l., Agrate Brianza (IT) and Wafer Scale Integration, Fremont, CA (U.S.A.) --

Signed and Sealed this

Twenty-eighth Day of May, 2002

*Attest:*

JAMES E. ROGAN
*Director of the United States Patent and Trademark Office*

*Attesting Officer*